US012681540B2

(12) United States Patent
Yoon et al.

(10) Patent No.: US 12,681,540 B2
(45) Date of Patent: Jul. 14, 2026

(54) ELECTRONIC DEVICE COMPRISING MICROPHONE MODULE

(71) Applicant: Samsung Electronics Co., Ltd., Suwon-si (KR)

(72) Inventors: Hyunjoong Yoon, Suwon-si (KR); Wansang Ryu, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 257 days.

(21) Appl. No.: 18/448,469

(22) Filed: Aug. 11, 2023

(65) Prior Publication Data

US 2023/0384836 A1 Nov. 30, 2023

Related U.S. Application Data

(63) Continuation of application No. PCT/KR2021/019806, filed on Dec. 24, 2021.

(30) Foreign Application Priority Data

Feb. 16, 2021 (KR) ........................ 10-2021-0020307

(51) Int. Cl.
| | |
|---|---|
| *G06F 1/16* | (2006.01) |
| *H04R 1/02* | (2006.01) |
| *H05K 5/03* | (2006.01) |

(52) U.S. Cl.
CPC .......... *G06F 1/1656* (2013.01); *G06F 1/1607* (2013.01); *H04R 1/02* (2013.01); *H05K 5/03* (2013.01)

(58) Field of Classification Search
CPC .. G06F 1/1656; G06F 1/1607; G06F 3/03545; G06F 1/1684; G06F 1/1698;
(Continued)

(56) References Cited

U.S. PATENT DOCUMENTS

| | | | | |
|---|---|---|---|---|
| 4,541,278 A | * | 9/1985 | Marsh | G01N 29/14 |
| | | | | 422/53 |
| 6,392,639 B1 | * | 5/2002 | Lee | G06F 1/1626 |
| | | | | 178/19.03 |

(Continued)

FOREIGN PATENT DOCUMENTS

| | | |
|---|---|---|
| CN | 206979004 U | 2/2018 |
| JP | 3225411 B2 | 11/2001 |

(Continued)

OTHER PUBLICATIONS

Extended European Search Report dated Jun. 6, 2024 issued in European Patent Application No. 21926925.5.

(Continued)

*Primary Examiner* — Gerald Gauthier

(74) *Attorney, Agent, or Firm* — Nixon & Vanderhye P.C.

(57) ABSTRACT

According to an embodiment of the present disclosure, an electronic device comprises: a microphone module including a microphone; a housing accommodating the microphone module and having at least one part surrounded by a protective cover configured to accommodate a digital pen, the housing comprising a microphone hole facing the protective cover; and a processor disposed inside the housing, wherein the processor may be configured to: determine a state of the digital pen mounted on the protective cover based on a sound generated by a protrusion of the protective cover contacting a groove of the digital pen, by the microphone module.

20 Claims, 11 Drawing Sheets

101

(58) Field of Classification Search

CPC .......... H04R 1/02; H04R 1/023; H04R 1/025; H04R 1/028; H04R 1/04; H04R 1/08; H05K 5/03; A45C 11/00; A45C 11/002; H04M 1/185; H04M 1/03; H04M 1/035; H04M 2201/34

See application file for complete search history.

(56)  References Cited

U.S. PATENT DOCUMENTS

| | | | | |
|---|---|---|---|---|
| 7,825,914 | B2 * | 11/2010 | Huang | G06F 1/1698 455/567 |
| 8,965,001 | B2 * | 2/2015 | Kang | H04R 1/04 381/91 |
| 9,326,057 | B2 * | 4/2016 | Lee | H04R 1/08 |
| 10,090,877 | B2 * | 10/2018 | Rayner | G06F 1/1656 |
| 11,209,873 | B2 * | 12/2021 | Castro | H04R 1/023 |
| 11,917,347 | B2 * | 2/2024 | Moon | H04M 1/035 |
| 2008/0231614 | A1 | 9/2008 | Huang et al. | |
| 2009/0114458 | A1 | 5/2009 | Chen et al. | |
| 2014/0020947 | A1 * | 1/2014 | Richardson | A45C 13/002 174/520 |
| 2014/0180481 | A1 * | 6/2014 | Park | G06F 3/0487 700/275 |
| 2014/0240911 | A1 * | 8/2014 | Cole | H05K 5/03 361/679.3 |
| 2016/0370887 | A1 * | 12/2016 | Yang | G06F 3/03545 |
| 2017/0078777 | A1 * | 3/2017 | Mittleman | H04R 1/025 |
| 2017/0180850 | A1 * | 6/2017 | Hsu | H04R 1/028 |
| 2018/0182409 | A1 * | 6/2018 | Venalainen | G10L 21/0208 |
| 2019/0379959 | A1 * | 12/2019 | Kim | H04R 3/005 |
| 2020/0174522 | A1 * | 6/2020 | Lim | G06F 1/1652 |
| 2020/0326843 | A1 * | 10/2020 | Zhai | G06F 1/1616 |
| 2023/0384836 | A1 * | 11/2023 | Yoon | A45C 11/00 |
| 2026/0032380 | A1 * | 1/2026 | Ji | G06F 1/1684 |

FOREIGN PATENT DOCUMENTS

| | | | |
|---|---|---|---|
| JP | 2012141841 | A | 7/2012 |
| JP | 2014063238 | A * | 4/2014 |
| KR | 20040013642 | A | 2/2004 |
| KR | 20130140966 | A | 12/2013 |
| KR | 20140082187 | A | 7/2014 |
| KR | 101464436 | B1 | 11/2014 |
| KR | 20150000403 | U | 1/2015 |
| KR | 101523486 | B1 | 5/2015 |
| KR | 20180092137 | A | 8/2018 |
| KR | 20190139629 | A | 12/2019 |

OTHER PUBLICATIONS

International Search Report for PCT/KR2021/019806 mailed Apr. 7, 2022, 5 pages.
Written Opinion of the ISA for PCT/KR2021/019806 mailed Apr. 7, 2022, 4 pages.

* cited by examiner

1

ELECTRONIC DEVICE COMPRISING MICROPHONE MODULE

CROSS-REFERENCE TO RELATED APPLICATIONS

This application is a continuation of International Application No. PCT/KR2021/019806 designating the United States, filed on Dec. 24, 2021, in the Korean Intellectual Property Receiving Office and claiming priority to Korean Patent Application No. 10-2021-0020307, filed on Feb. 16, 2021, in the Korean Intellectual Property Office, the disclosures of each of which are incorporated by reference herein in their entireties.

BACKGROUND

Field

An embodiment of the disclosure relates to an electronic device including a microphone module.

Description of Related Art

Due to the development of information communication technology, semiconductor technology, and the like, the distribution and use of various electronic devices are rapidly increasing. In particular, recent electronic devices are being developed such that users are capable of communicating with each other while carrying the electronic devices. In addition, the electronic devices may output information stored therein as sound or an image. With the increase of degree of integration of electronic devices and the generalization of ultra-high-speed and high-capacity wireless communication, recently, various functions may be installed in a single electronic device, such as a mobile communication terminal. For example, various functions, such as an entertainment function (e.g., a game function), a multimedia function (e.g., a music/video reproduction function), a communication and security function for mobile banking or the like, a schedule management function, and an e-wallet function, are being integrated in a single electronic device, in addition to a communication function. These electronic devices are being downsized to be conveniently carried by users.

An electronic device may receive various inputs from a user via an input device (e.g., a digital pen). The electronic device may identify a position on the electronic device designated by the input device and may perform a corresponding function. For example, the electronic device may identify a position on the electronic device designated by the input device using an electromagnetic resonance (hereinafter, referred to as "EMR") method or an active electrostatic (hereinafter, referred to as "AES") method.

The electronic device may determine whether or not a digital pen is mounted on the electronic device using a physical switch, magnet, or Hall sensor, and perform a corresponding function based on whether or not the digital pen is mounted on the electronic device. However, when determining whether a digital pen is mounted on an electronic device or a protection cover using a physical switch, magnet, or Hall sensor, a mounting space may be reduced or the manufacturing cost of the electronic device may be increased.

SUMMARY

An embodiment of the disclosure may provide an electronic device capable of determining whether a digital pen is mounted on a protection cover using a sound signal.

According to various example embodiments of the present disclosure, an electronic device may include: a microphone module, a housing configured to accommodate the microphone module and to be at least partially surrounded by a protection cover configured to accommodate a digital pen, wherein the housing includes a microphone hole facing the protection cover, and a processor disposed within the housing. The processor may be configured to: determine, using the microphone module, a mounting state of the digital pen with respect to the protection cover based on sound generated based on contact between a protrusion structure of the protection cover and a groove structure of the digital pen.

According to various example embodiments of the present disclosure, an electronic device may include: a housing, a protection cover configured to protect the housing, wherein the protection cover includes an accommodation groove configured to accommodate a digital pen, and a protrusion extending from the accommodation groove and configured to contact the groove structure of the digital pen, and a processor disposed within the housing. The processor may be configured to: determine a mounting state of the digital pen with respect to the protection cover based on sound generated based on contact between the protrusion structure and the groove structure.

According to various example embodiments of the present disclosure, an electronic device may include: a housing, a digital pen including a first groove including at least one first groove, a second groove including at least one second groove, and a support area located between the first groove and the second groove, a protection cover configured to protect the housing, wherein the protection cover includes an accommodation groove configured to accommodate the digital pen, and a protrusion extending from the accommodation groove and configured to contact the first groove structure or the second groove structure, and a processor disposed within the housing. The processor may be configured to: determine a mounting state of the digital pen with respect to the protection cover based on sound generated based on contact between the protrusion structure and the digital pen.

According to various example embodiments of the present disclosure, an electronic device may include: a digital pen including a first groove including at least one first groove, a second groove including at least one second groove, and a support area located between the first groove and the second groove, a protection cover including an accommodation groove configured to accommodate the digital pen, wherein the protection cover may include a protrusion extending from the accommodation groove and configured to contact the first groove structure or the second groove structure of the digital pen.

According to various example embodiments of the present disclosure, a protection cover configured to protect a housing of an electronic device may include: an accommodation groove configured to accommodate a digital pen, a protrusion protruding from the accommodation groove and configured to contact a groove of the digital pen, a first through hole extending from the accommodating groove and configured to transmit sound generated based on contact between the protrusion structure and the digital pen to a microphone module including a microphone of the electronic device, and a second through hole extending from the accommodation groove, wherein the accommodation groove may be located between the first through hole and the second through hole.

According to various example embodiments of the disclosure, the mounting state of the protection cover of the digital pen can be determined by the electronic device using the microphone module. Since a physical switch, magnet, or Hall sensor for determining whether a digital pen is mounted may not be included the electronic device, the manufacturing cost of the electronic device can be reduced and the internal mounting space can be increased.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
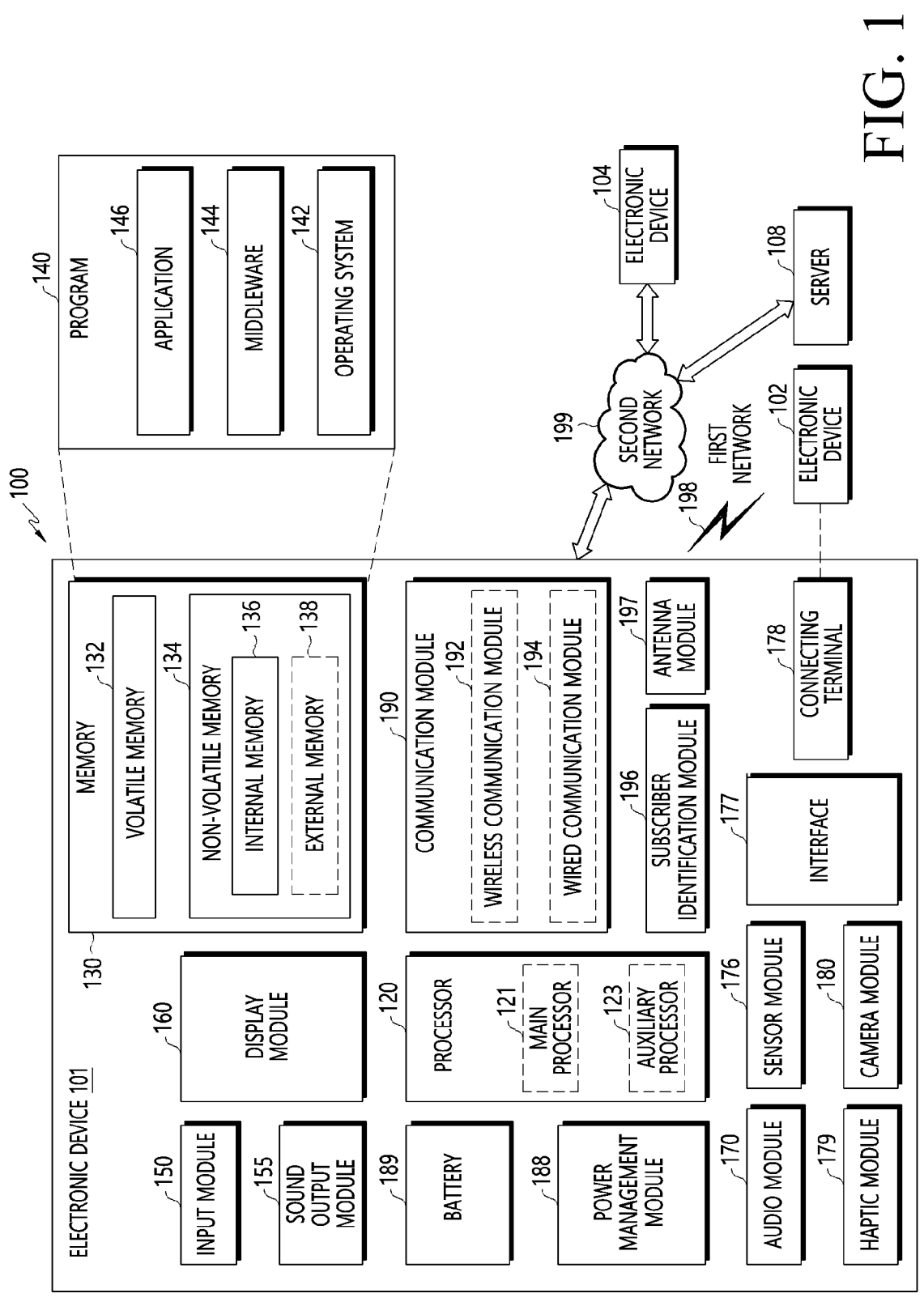
FIG. 1 is a block diagram illustrating an example electronic device an embodiment in a network environment according to an embodiment.

FIG. 1 is a block diagram illustrating an example electronic device 101 in a network environment 100 according to an embodiment.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In an embodiment, at least one of the components (e.g., the connecting terminal 178) may be omitted from the electronic device 101, or one or more other components may be added in the electronic device 101. In an embodiment, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device 104 via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to an embodiment, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to an embodiment may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that an embodiment of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used in connection with an embodiment of the disclosure, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

According to an embodiment, each component (e.g., a module or a program) of the above-described components may include a single entity or multiple entities, and some of the multiple entities may be separately disposed in different components. According to an embodiment, one or more of the above-described components may be omitted, or one or more other components may be added. Alternatively or additionally, a plurality of components (e.g., modules or programs) may be integrated into a single component. In such a case, according to an embodiment, the integrated component may still perform one or more functions of each of the plurality of components in the same or similar manner as they are performed by a corresponding one of the plurality of components before the integration. According to an embodiment, operations performed by the module, the program, or another component may be carried out sequentially, in parallel, repeatedly, or heuristically, or one or more of the operations may be executed in a different order or omitted, or one or more other operations may be added.

Figure 2:
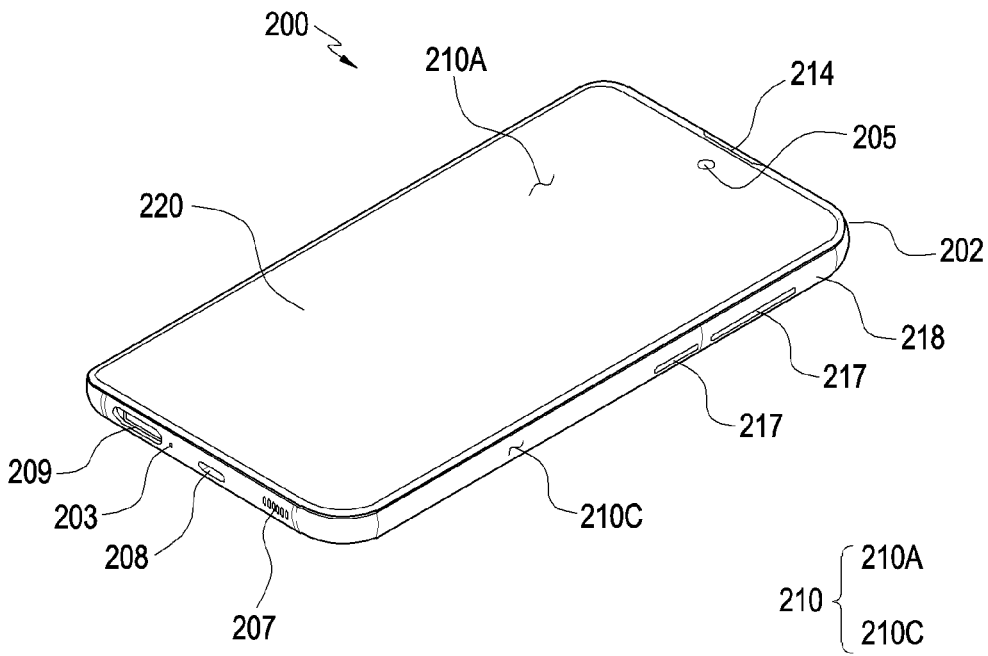
FIG. 2 is a front perspective view illustrating the electronic device according to an embodiment.
Figure 3:
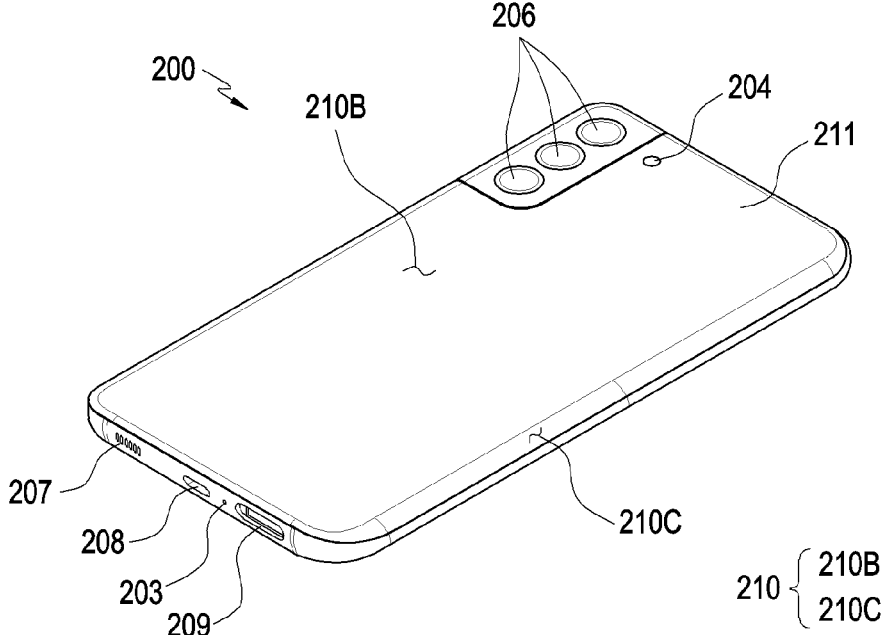
FIG. 3 is a rear perspective view illustrating the electronic device according to an embodiment.

FIG. 2 is a front perspective view illustrating the electronic device according to an embodiment. FIG. 3 is a rear perspective view illustrating the electronic device according to an embodiment.

Referring to FIGS. 2 and 3, a portable electronic device 200 according to an embodiment may include a housing 210 including a front surface 210A, a rear surface 210B, and a side surface 210C surrounding the space between the front surface 210A and the rear surface 210B. In an embodiment (not illustrated), the term "housing 210" may refer to a structure defining some of the front surface 210A of FIG. 2, and the rear surface 210B and the side surface 210C of FIG. 3. According to an embodiment, at least a portion of the front surface 210A may be defined by a substantially transparent front surface plate 202 (e.g., a glass plate or a polymer plate including various coating layers). The rear surface 210B may be defined by the rear surface plate 211. The rear surface plate 211 may be made of, for example, glass, ceramic, polymer, plastic (e.g., PC or PC-GF), metal (e.g., aluminum, stainless steel (STS), or magnesium), or a combination of two or more of these materials. The side surface 210C may be defined by a side surface bezel structure (or a "side surface member") 218 coupled to the front surface plate 202 and the rear surface plate 211 and including metal and/or polymer. In an embodiment, the rear surface plate 211 and the side surface bezel structure 218 may be configured integrally with each other and may include the same material (e.g., glass, a metal material such as aluminum, ceramic, or plastic). According to an embodiment, the front surface 210A and/or the front plate 202 may be interpreted as a part of the display 220. According to an embodiment, the housing 210 may include a front surface plate 202 and a rear surface plate 211.

According to an embodiment, the portable electronic device 200 may include at least one of a display 220, an audio module 203, 207, or 214 (e.g., the audio module 170 in FIG. 1), a sensor module (e.g., the sensor module 176 in FIG. 1), a camera module 205 or 206 (e.g., the camera module 180 in FIG. 1), a key input device 217 (e.g., the input module 150 in FIG. 1), and a connector hole 208 or 209 (e.g., the connection terminal 178 in FIG. 1). In an embodiment, in the portable electronic device 200, at least one of the components (e.g., the connector hole 209) may be omitted, or other components may be additionally included.

According to an embodiment, the display 220 may be visually exposed (e.g., visible), for example, through a substantial portion of the front surface plate 202. In an embodiment, at least a portion of the display 220 may be visible through the front surface plate 202 defining the front surface 210A. According to an embodiment, the display 220 may be a flexible display or a foldable display.

According to an embodiment, the surface of the housing 210 (or the front surface plate 202) may include a screen display area provided since the display 220 is visually exposed (e.g., visible). For example, the screen display area may include the front surface 210A.

In an embodiment (not illustrated), the portable electronic device 200 may include a recess or opening provided in a portion of the screen display area (e.g., the front surface 210A) of the display 220, and may include at least one of an audio module 214, a sensor module (not illustrated), a light-emitting element (not illustrated), and a camera module 205 aligned with the recess or opening. In an embodiment (not illustrated), the rear surface of the screen display area of the display 220 may include at least one of an audio module 214, a sensor module (not illustrated), a camera module 205, a fingerprint sensor (not illustrated), and a light-emitting element (not illustrated).

Figure 7:
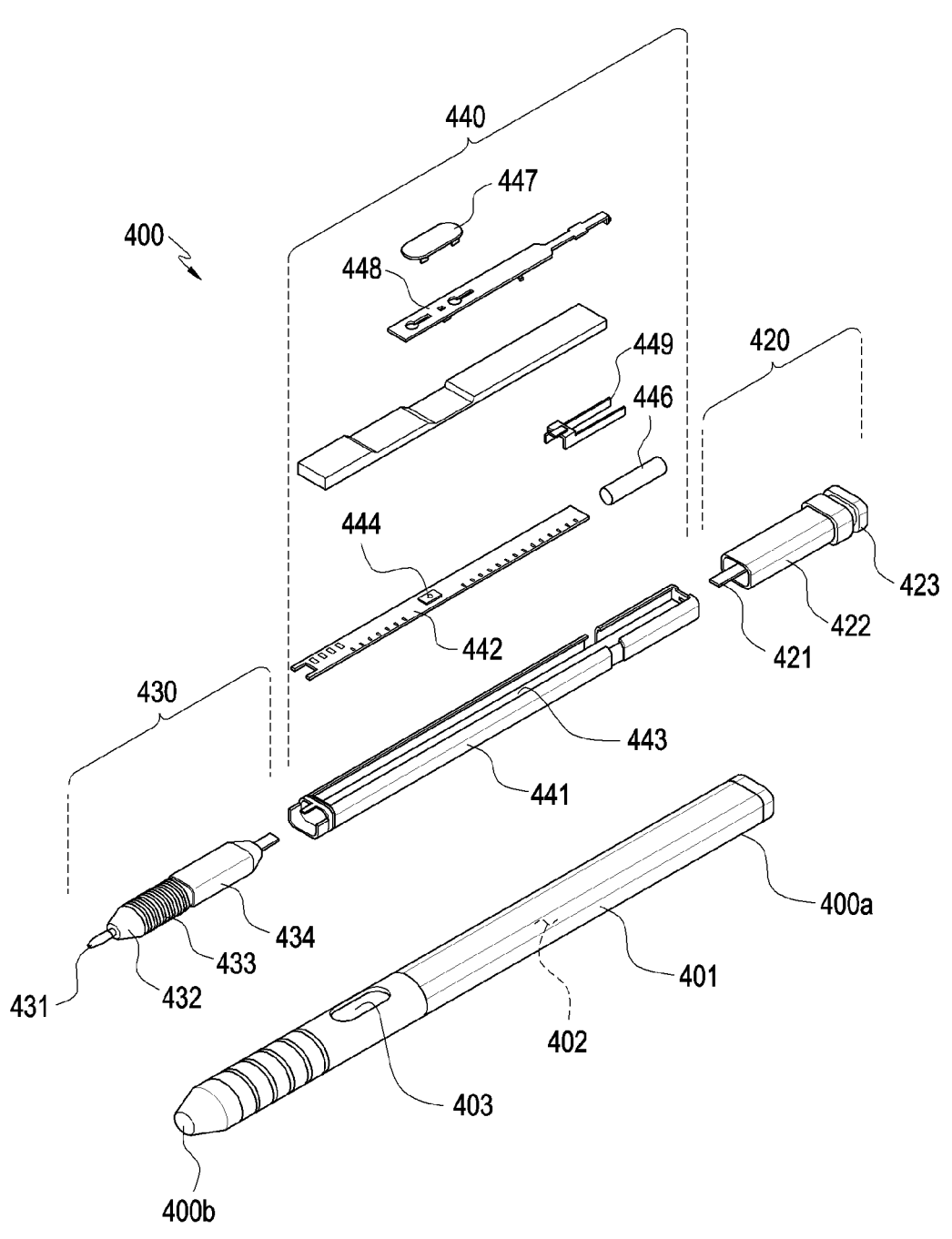
FIG. 7 is an exploded perspective view of the digital pen according to an embodiment.

In an embodiment (not illustrated), the display 220 may be coupled to or disposed adjacent to a touch-sensitive circuit, a pressure sensor capable of measuring a touch intensity (pressure), and/or a digitizer configured to detect an electromagnetic field-type stylus pen (e.g., the digital pen 400 in FIG. 7).

In an embodiment, at least a portion of the key input device 217 may be disposed on the side bezel structure 218.

According to an embodiment, the audio modules 203, 207, and 214 may include, for example, a microphone hole 203 and speaker holes 207 and 214. The microphone hole 203 may include a microphone disposed therein to acquire external sound, and in an embodiment, a plurality of microphones may be disposed therein to be able to detect the direction of sound. The speaker holes 207 and 214 may include an external speaker hole 207 and a communication receiver hole 214. In an embodiment, while implementing the speaker holes 207 and 214 and the microphone hole 203 as a single hole, or without the speaker holes 207 and 214, a speaker (e.g., a piezo speaker) may be included.

According to an embodiment, sensor modules (not illustrated) may generate an electrical signal or a data value corresponding to, for example, an internal operating state of the portable electronic device 200 or an external environmental state. The sensor modules (not illustrated) may include, for example, a first sensor module (not illustrated) (e.g., a proximity sensor) and/or a second sensor module (not illustrated) (e.g., a fingerprint sensor) disposed on the front surface 210A of the housing 210, and/or a third sensor module (not illustrated) (e.g., an HRM sensor) and/or a fourth sensor module (not illustrated) (e.g., a fingerprint sensor) disposed on the rear surface 210B of the housing 210. In an embodiment (not illustrated), the fingerprint sensor may be disposed not only on the front surface 210A (e.g., the display 220) of the housing 210, but also on the rear surface 210B. The portable electronic device 200 may further include at least one of sensor modules (not illustrated in the drawings), such as a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor (not illustrated).

According to an embodiment, the camera modules 205 and 206 may include, for example, a front camera module 205 disposed on the front surface 210A of the portable electronic device 200, a rear camera module 206 disposed on the rear surface 210B, and/or a flash 204. The camera modules 205 and 206 may include one or more lenses, an image sensor, and/or an image signal processor. The flash 204 may include, for example, a light-emitting diode or a xenon lamp. In an embodiment, two or more lenses (e.g., an infrared camera, a wide-angle lens, and a telephoto lens), and image sensors may be disposed on one surface of the portable electronic device 200.

According to an embodiment, the key input device 217 may be disposed on the side surface 210C of the housing 210. In an embodiment, the portable electronic device 200 may not include some or all of the above-mentioned key input devices 217, and the key input devices 217, which are not included in the electronic device 220, may be implemented in another form, such as soft keys, on the display 101.

According to an embodiment, the light-emitting element (not illustrated) may be disposed on, for example, the front surface 210A of the housing 210. The light-emitting element (not illustrated) may provide, for example, the state information of the portable electronic device 200 in an optical form. In an embodiment, the light-emitting element (not illustrated) may provide a light source that is interlocked with, for example, the operation of the front camera module 205. The light-emitting element (not illustrated) may include, for example, an LED, an IR LED, and/or a xenon lamp.

According to an embodiment, the connector holes 208 and 209 may include, for example, a first connector hole 208 capable of accommodating a connector (e.g., a USB connector) configured to transmit/receive power and/or data to/from an external electronic device, and a second connector hole (e.g., an earphone jack) 209 capable of accommodating a connector configured to transmit/receive an audio signal to/from an external electronic device. According to an embodiment, the first connector hole 208 and/or the second connector hole 209 may be omitted.

Although the portable electronic device 200 illustrated in FIGS. 2 and 3 has a bar-type or plate-type appearance, the disclosure is not limited thereto. For example, the illustrated electronic device may be a part of a rollable electronic device or a foldable electronic device. The term "rollable electronic device" may refer, for example, to an electronic device in which a display (e.g., the display 220 in FIG. 2) is transformable by bending thereby allowing the display to be at least partially wound or rolled or to be accommodated into the housing (e.g., the housing 210 in FIG. 2). According to a user's need, the rollable electronic device may be used in the state in which the screen display area is expanded by unfolding the display or exposing (e.g., making visible) a larger area of the display to the outside. The term "foldable electronic device" may refer, for example, to an electronic device that is foldable such that two different areas of the display face each other or are oriented in opposite directions. In general, in a foldable electronic device in a carried state, the display is folded in the state in which two different areas face each other or are oriented in opposite directions, and in actual use, a user may unfold the display such that the two different areas provide a substantially flat plate shape. In an embodiment, the term "portable electronic device 200" according to an embodiment disclosed herein may be interpreted as including not only a portable electronic device such as a smartphone, but also various other electronic devices such as a notebook computer or a home appliance.

Figure 4:
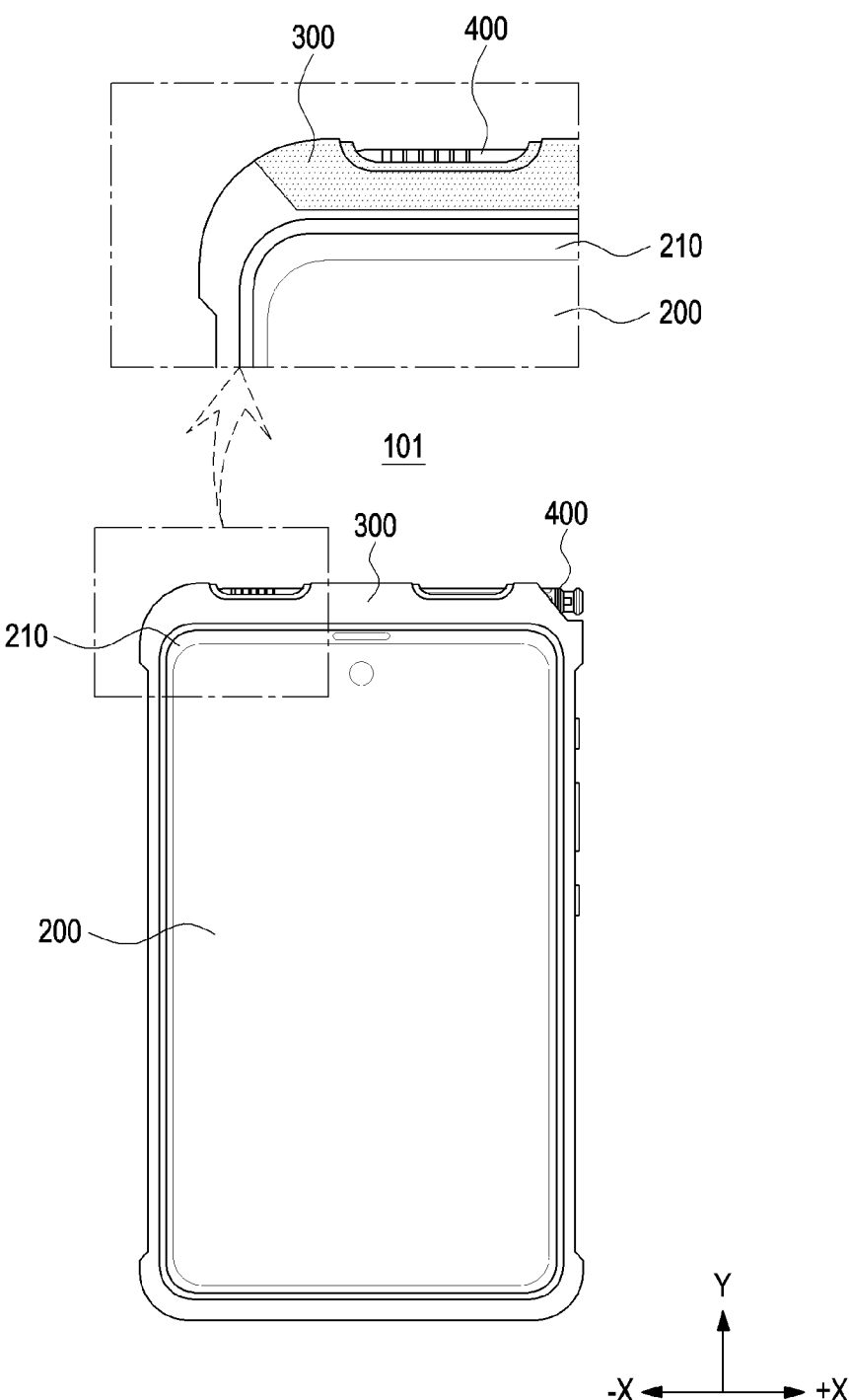
FIG. 4 is a diagram illustrating an electronic device including a protection cover according to an embodiment.
Figure 5:
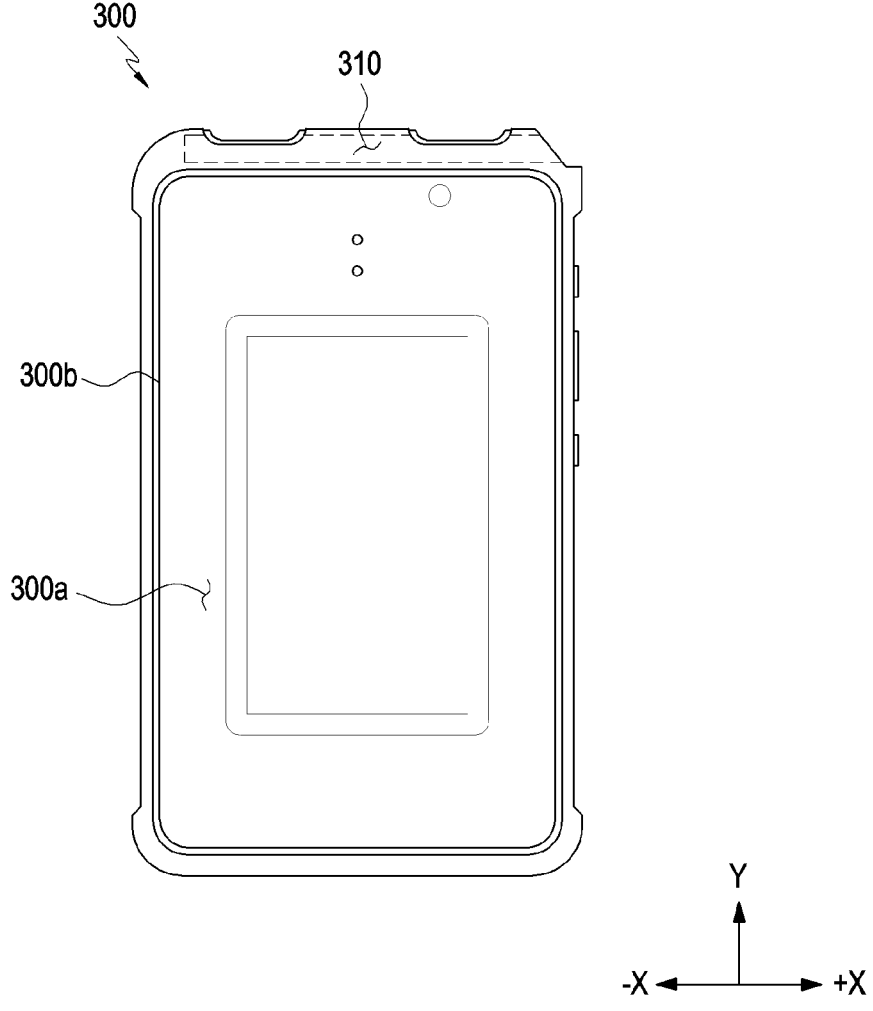
FIG. 5 is a diagram illustrating the protection cover according to an embodiment.

FIG. 4 is a diagram illustrating a front view of an electronic device including a protection cover according to an embodiment. FIG. 5 is a diagram illustrating a front view of the protection cover according to an embodiment.

Referring to FIGS. 4 and 5, the electronic device 101 may include a portable electronic device 200, a housing 210, a protection cover 300, and a digital pen 400. Some or all of the components of the portable electronic device 200 and the housing 210 of FIG. 4 may be the same as or similar to those of the portable electronic device 200 and the housing 210 of FIGS. 2 and 3.

According to an embodiment, the protection cover 300 may protect the portable electronic device 200 from an external impact. For example, the protection cover 300 may accommodate at least a portion of the portable electronic device 200 and may surround at least a portion of the housing 210 of the portable electronic device 200. According to an embodiment, the protection cover 300 may at least partially surround the rear surface (e.g., the rear surface 210B in FIG. 3), the side surface (e.g., side surface 210C in FIG. 2), or the front surface (e.g., the front surface 210A in FIG. 2) of the portable electronic device 200. For example, the protection cover 300 may include a first surface 300*a* facing the rear surface 210B of the portable electronic device 200, and a second surface 300*b* extending from the first surface 300*a* and facing at least a portion of the side surface 210C or the front surface 210A.

According to an embodiment, the protection cover 300 may be made of an elastic body. According to an embodiment, the protection cover 300 may be a thermoplastic polyurethane case. According to an embodiment, the protection cover 300 may include at least one of thermoplastic polyurethane and silicone.

According to an embodiment, the protection cover 300 may accommodate the digital pen 400. For example, the protection cover 300 may include an accommodation groove 310 configured to accommodate the digital pen 400. According to an embodiment, the accommodation groove 310 may be a groove or a recess provided in the protection cover 300. For example, the accommodation groove 310 may be an empty space or a reception space configured to accommodate the digital pen 400.

According to an embodiment, the digital pen 400 may be inserted into the accommodation groove 310 of the protection cover 300. According to an embodiment, the digital pen 400 may be inserted into the protection cover 300 in a first direction (e.g., the −X direction) and may be separated from the protection cover 300 in a second direction (e.g., the +X direction). According to an embodiment, in a state in which the digital pen 400 is inserted into the protection cover 300, at least a portion of the digital pen 400 may be visually exposed to the outside of the protection cover 300. For example, in the state in which the digital pen 400 is inserted into the protection cover 300, a user may touch the digital pen 400 and may move the digital pen 400 out of the protection cover 300.

According to an embodiment, a state in which the digital pen 400 is located in the accommodation groove 310 of the protection cover 300 (e.g., FIG. 4) may be understood as a standby state or a first state, and a state in which the digital pen 400 is located outside the protection cover 300 (not illustrated) may be understood as a use state or a second state.

Figure 6:
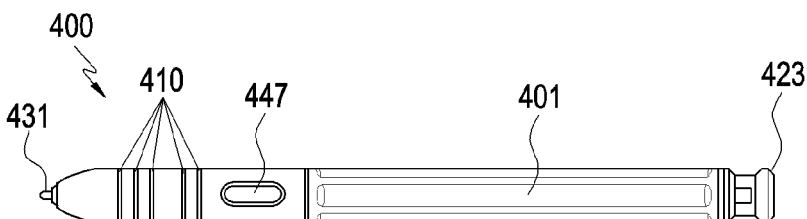
FIG. 6 is a diagram illustrating a digital pen according to an embodiment.

FIG. 6 is a diagram illustrating a front view of a digital pen according to an embodiment. FIG. 7 is an exploded perspective view of the digital pen according to an embodiment.

Referring to FIGS. 6 and 7, a digital pen 400 may include a pen housing 401 defining at least a portion of the appearance of the digital pen 400 and internal assemblies 420, 430, and 440 disposed inside the pen housing 401. In the illustrated embodiment, at least some of the internal assemblies 420, 430, and 440 may include several components mounted inside the pen housing 401. All or some of the components of the digital pen 400 of FIGS. 6 and 7 may be the same as or similar to those of the digital pen 400 of FIG. 4.

The pen housing 401 has an elongated shape between a first end portion 400a and a second end portion 400b and may include a second accommodation space 402 therein. According to an embodiment (e.g., FIG. 6), the cross section of the pen housing 400 may have a substantially circular shape. According to an embodiment (not illustrated), the cross section of the pen housing 401 may have an elliptical shape having a major axis and a minor axis, and may be fabricated in a generally elliptical column shape. According to an embodiment, the accommodation groove (e.g., the protection cover 310 in FIG. 5) of the protection cover (e.g., the protection cover 300 in FIG. 5) may be fabricated in a shape corresponding to the shape of the pen housing 301. The pen housing 401 may include a synthetic resin (e.g., plastic) and/or a metallic material (e.g., aluminum). According to an embodiment, the second end portion 400b of the pen housing 401 may be made of a synthetic resin material. According to an embodiment, the pen housing 401 may include a groove structure (e.g., including at least one or a plurality of grooves) 410 (e.g., the groove structure 410 in FIG. 9). The groove structure 410 will be described in greater detail below with reference to FIG. 9.

The internal assemblies may have an elongated shape corresponding to the shape of the pen housing 401. The internal assemblies may be generally divided into three configurations along the longitudinal direction. For example, the internal assemblies may include an ejection member 420 disposed at a position corresponding to the first end portion 400a of the pen housing 401, a coil section 430 disposed at a position corresponding to the second end portion 400 of the pen housing 401, and a circuit board section 440 disposed at a position corresponding to the body of the housing.

The ejection member 420 may include a component for extracting the digital pen 400 from the accommodation groove 310 of the protection cover 300. According to an embodiment, the ejection member 420 may include a shaft 421, an ejection body 422 disposed around the shaft 421 to define the overall appearance of the ejection body 422, and a button section 423. When the internal assemblies are completely inserted into the pen housing 401, the portion including the shaft 421 and the ejection body 422 is surrounded by the first end portion 400a of the pen housing 401, and the button section 423 may be exposed to the outside of the first end portion 400a. A plurality of components (not illustrated), for example, cam members or elastic members, may be disposed within the ejection body 422 to provide a push-pull structure. In an embodiment, the button section 423 may be substantially coupled to the shaft 421 and linearly reciprocate with respect to the ejection body 422. According to an embodiment, the button section 423 may include a button having an engagement structure to allow the user to extract the digital pen 400 using a fingernail. According to an embodiment, the digital pen 400 may provide another input method by including a sensor that detects linear reciprocating motion of the shaft 421.

The coil section 430 may include a pen tip 431 exposed to the outside of the second end portion 400b when the internal assemblies are fully inserted into the pen housing 401, a packing ring 432, a coil 433 wound multiple times, and/or a writing pressure sensor 434 configured to acquire a change in pressure in response to pressing of the pen tip 431. The packing ring 432 may include epoxy, rubber, urethane, or silicone. The packing ring 432 may be provided for waterproofing and dustproofing purposes, and may protect the coil section 430 and the circuit board section 440 from flooding or dust. According to an embodiment, the coil 433 may form a resonance frequency in a configured frequency band (e.g., 500 kHz) and may be combined with at least one element (e.g., a capacitive element (a capacitor)) to adjust the resonance frequency formed by the coil 433 within a predetermined range.

The circuit board section 440 may include a printed circuit board 442, a base 441 surrounding at least one surface of the printed circuit board 442, and an antenna. According to an embodiment, a substrate seating portion 443 on which the printed circuit board 442 is disposed is provided on the top surface of the base 441, and the printed circuit board 442 may be fixed in the state of being seated on the substrate seating portion 443. According to an embodiment, the printed circuit board 442 may include a top surface and a bottom surface, wherein a variable capacitance capacitor or a switch 444 connected to the coil 433 may be disposed on the top surface, and a charging circuit, a battery, or a communication circuit may be disposed on the bottom surface. The battery may include an electric double layered capacitor (EDLC). The charging circuit is located between the coil 433 and the battery, and may include a voltage detector circuit and a rectifier.

The antenna may include an antenna structure 449 as in the example illustrated in FIG. 7 and/or an antenna embedded in the printed circuit board 442. According to an embodiment, a switch 444 may be provided on the printed circuit board 442. A side button 447 provided on the digital pen 400 may be used to push the switch 444 and may be exposed to the outside through a side surface opening 403 in the pen housing 301. When the side button 447 is supported by a support member 448 and there is no external force acting on the second button 447, the support member 448 may provide an elastic restoration force to restore or hold the side button 447 in the state of being disposed at a predetermined position.

The circuit board section 440 may include a packing ring such as an O-ring. For example, O-rings made of an elastic body may be disposed at opposite ends of the base 441 to provide a sealing structure between the base 441 and the pen housing 401. In an embodiment, the support member 448 may partially come into close contact with the inner wall of the pen housing 401 around the side surface opening 403 so as to form a sealing structure. For example, the circuit board section 440 may also provide a waterproofing and dustproofing structure similar to the packing ring 432 of the coil section 430.

The digital pen 400 may include a battery seating portion 445 in which a battery 446 is disposed on the top surface of the base 441. The battery 446 that is mountable on the battery seating portion 445 may include, for example, a cylinder-type battery.

The digital pen 400 may include a microphone (not illustrated). The microphone may be directly connected to the printed circuit board 442 or may be connected to a separate flexible printed circuit board (FPCB) (not illustrated) connected to the printed circuit board 442. According to an embodiment, the microphone may be disposed at a position parallel to the side button 447 in the long direction of the digital pen 400.

Figure 8:
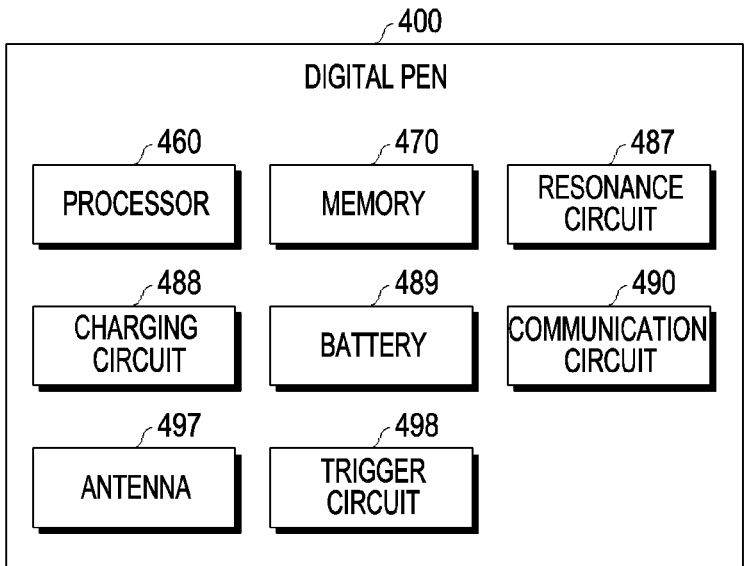
FIG. 8 is a block diagram illustrating an example configuration of a digital pen according to an embodiment.

FIG. 8 is a block diagram illustrating an example configuration of a digital pen according to an embodiment.

Referring to FIG. 8, the digital pen 400 may include a processor (e.g., including processing circuitry) 460, a memory 470, a resonance circuit 487, a charging circuit 488, a battery 489, a communication circuit 490, an antenna 497, and/or a trigger circuit 498. In an embodiment, the processor 460 of the digital pen 400, at least part of the resonance circuit 487, and/or at least part of the communication circuit 490 may be configured on a printed circuit board or in the form of a chip. The processor 460, the resonance circuit 487, and/or the communication circuit 490 may be electrically connected to the memory 470, the charging circuit 488, the battery 489, the antenna 497, or the trigger circuit 498. The digital pen 400 according to an embodiment may include only a resonance circuit and a button.

The processor 460 may include various processing circuitry including, for example, a customized hardware module or a generic processor configured to execute software (e.g., application program). The processor may include a hardware component (function) or a software element (program) including at least one of various sensors provided in the digital pen 400, a data measurement module, an input/output interface, a module configured to manage the state or environment of the digital pen 400, or a communication module. The processor 460 may include one or a combination of two or more of, for example, hardware, software, or firmware. According to an embodiment, the processor 460 may receive a proximity signal corresponding to an electromagnetic field signal generated from a digitizer included in a display module 160 of an electronic device (e.g., the electronic device 101 in FIG. 1) through the resonance circuit 487. When the proximity signal is identified, the resonance circuit 487 may be controlled to transmit an electromagnetic resonance (EMR) input signal to the electronic device 101.

The memory 470 may store information related to the operation of the digital pen 400. For example, the information may include information for communication with the electronic device 101 and frequency information associated with an input operation of the digital pen 400.

The resonance circuit 487 may include at least one of a coil, an inductor, or a capacitor. The resonance circuit 487 may be used by the digital pen 400 to generate a signal including a resonance frequency. For example, in order to generate the signal, the digital pen 400 may use at least one of an electro-magnetic resonance (EMR) method, an active electrostatic (AES) method, or an electrically coupled resonance (ECR) method. When the digital pen 400 transmits a signal by an EMR method, the digital pen 400 may generate a signal including a resonant frequency based on an electromagnetic field generated by an inductive panel of the electronic device 101. When the digital pen 400 transmits a signal by the AES method, the digital pen 400 may generate a signal using capacity coupling with the electronic device 101. When the digital pen 400 transmits a signal by the ECR method, the digital pen 400 may generate a signal including a resonant frequency based on an electric field generated by a capacitive device of the electronic device 101. According to an embodiment, the resonance circuit 487 may be used to change the intensity or frequency of the electromagnetic field depending on a user's operating state. For example, the resonance circuit 487 may provide frequencies for recognizing a hovering input, a drawing input, a button input, or an erasing input.

When the charging circuit 488 is connected to the resonance circuit 487 based on a switching circuit, a resonance signal generated by the resonance circuit 487 may be rectified into a DC signal and may be provided to the battery 489. According to an embodiment, the digital pen 400 may identify whether the digital pen 400 is inserted into the protection cover (e.g., the protection cover 300 in FIG. 5) using the voltage level of the DC signal detected by the charging circuit 488.

The battery 489 may be configured to store power required for operation of the digital pen 400. The battery may include, for example, a lithium-ion battery or a capacitor, and may be rechargeable or replaceable. According to an embodiment, the battery 489 may be charged using power (e.g., a DC signal (DC power)) supplied from the charging circuit 488.

The communication circuit 490 may be configured to perform a wireless communication function between the digital pen 400 and the communication module (e.g., the communication module 190 in FIG. 1) of the electronic device (e.g., the electronic device 101 in FIG. 1). According to an embodiment, the communication circuit 490 may transmit state information and input information of the digital pen 400 to the electronic device 101 using a short-range communication method. For example, the communication circuit 490 may transmit, to the electronic device 101, direction information of the digital pen 400 (e.g., motion sensor data) acquired through the trigger circuit 498, voice information input via a microphone, or information on the remaining amount of the battery 489. As an example, the short-range communication method may include at least one of Bluetooth, Bluetooth Low Energy (BLE), or wireless LAN.

The antenna 497 may be used to transmit/receive a signal or power to/from the outside (e.g., the electronic device 101). According to an embodiment, the digital pen 400 may include a plurality of antennas 497 and may select at least one antenna 497 suitable for the communication method from among the plurality of antennas 497. Via the selected at least one antenna 497, the communication circuit 490 may exchange a signal or power with an external electronic device.

The trigger circuit 498 may include at least one button or a sensor circuit. According to an embodiment, the processor 460 may identify an input method (e.g., touch or push) or the type (e.g., an EMR button or a BLE button) of the button of the digital pen 400. According to an embodiment, the sensor circuit may generate an electrical signal or a data value corresponding to an internal operating state or an external environmental state of the digital 400. For example, the sensor circuit may include at least one of a motion sensor, a remaining battery capacity detection sensor, a pressure sensor, an optical sensor, a temperature sensor, a geomagnetic sensor, and a biometric sensor. According to an embodiment, the trigger circuit 498 may transmit a trigger signal to the electronic device 101 using an input signal of the button or a signal acquired through a sensor.

Figure 9:
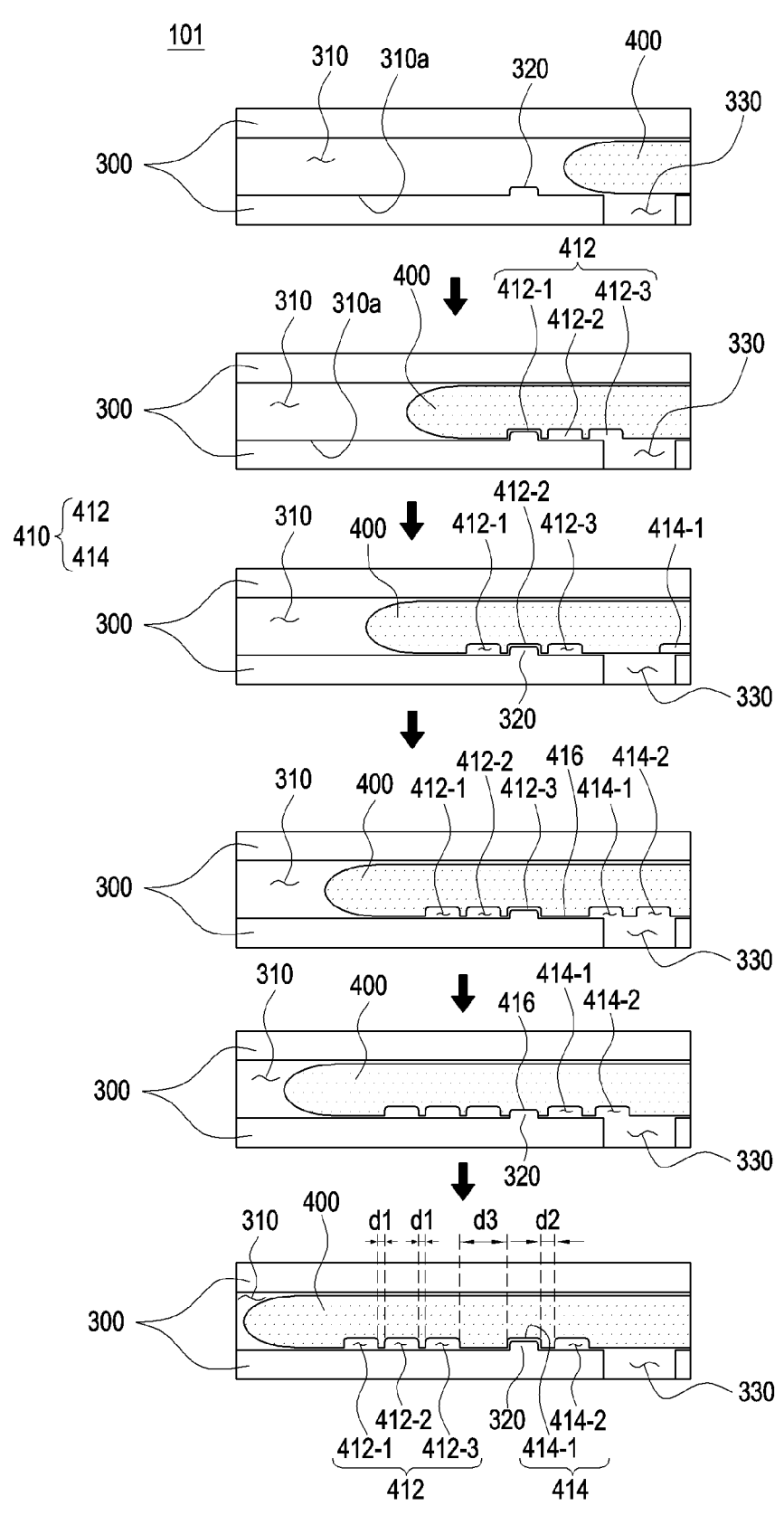
FIG. 9 is a diagram illustrating an example operation of inserting a digital pen into a protection cover according to an embodiment.

FIG. 9 is a diagram illustrating an example operation of inserting a digital pen into a protection cover according to an embodiment.

Referring to FIG. 9, the digital pen 400 may be inserted into the accommodation groove 310 of the protection cover 300. All or some of the components of the protection cover 300 of FIG. 9 are the same as or similar to those of the protection cover 300 of FIGS. 4 and 5, and all or some of the components of the digital pen 400 of FIG. 9 are the same as or similar to those of the digital pen 400 of FIGS. 6 to 8.

According to an embodiment, the protection cover 300 may include a protrusion structure 320. According to an embodiment, the protrusion structure 320 may extend from the accommodation groove 310. For example, the protection cover 300 may include a first inner surface 310a defining at least a portion of the inner surface of the accommodation groove 310, and the protrusion structure 320 may extend from the first inner surface 310a. According to an embodiment, the protrusion structure 320 may be made of an elastic body. According to an embodiment, the protrusion structure 320 may include at least one of thermoplastic polyurethane or silicone.

According to an embodiment, the protection cover 300 may include at least one first through hole 330 extending from the accommodation groove 310. According to an embodiment, the first through hole 330 may extend toward a housing (e.g., the housing 210 in FIG. 4) of an electronic device (e.g., the portable electronic device 200 in FIG. 4). According to an embodiment, the first through hole 330 may penetrate at least a portion of the first inner surface 310a of the protection cover 330. According to an embodiment, sound generated by the contact between the protrusion structure 320 of the protection cover 300 and the digital pen 400 may be transferred to the microphone module (e.g., the microphone module 230 in FIG. 10) of the portable electronic device 200 through the first through hole 330. According to an embodiment, the first through hole 330 may be located adjacent to the protrusion structure 320.

According to an embodiment, the digital pen 400 may include a groove structure 410 (refer, e.g., to FIG. 6). According to an embodiment, the groove structure 410 may be a groove or a recess provided in the pen housing of the digital pen 400 (e.g., the pen housing 401 in FIG. 7). According to an embodiment, the groove structure 410 may surround at least a portion of the pen housing 401. For example, the groove structure 410 may be a ring-shaped groove.

According to an embodiment, the groove structure 410 may accommodate the protrusion structure 320 of the protection cover 300. For example, the protrusion structure 320 may be disposed within a groove of the groove structure 410 (e.g., the $(1-1)^{th}$ groove 412-1, the $(1-2)^{th}$ groove 412-2, the $(1-3)^{th}$ groove 412-3, the $(2-1)^{th}$ groove 414-1, or the $(2-2)^{th}$ groove 414-2). According to an embodiment, the protrusion structure 320 may come into contact or collide with the groove structure 410 based on the sliding motion of the digital pen 400. When the protrusion structure 320 comes into contact or collides with the groove structure 410, sound may be generated. For example, by the contact or collision between the protrusion structure 320 and the groove structure 410, sound recognized as click by the user may be generated.

According to an embodiment, the groove structure 410 may include a plurality of groove structures 412 and 414. According to an embodiment, the digital pen 400 may include a first groove structure 412 including at least one first groove (e.g., the $(1-1)^{th}$ groove 412-1, the $(1-2)^{th}$ groove 412-2, and/or the $(1-3)^{th}$ groove 412-3), a second groove structure 412 including at least one second groove (e.g., the $(2-1)^{th}$ groove 414-1), and a support area 416 located between the first groove structure 412 and the second groove structure 414. According to an embodiment, the first groove structure 412 may be located closer to the pen tip 431 of the digital pen 400 than the second groove structure 414.

According to an embodiment, the protrusion structure 320 of the protection cover 300 may come into contact with the groove structure 410 based on the sliding movement of the digital pen 400. For example, when the digital pen 400 is inserted into the accommodation groove 310 of the protection cover 300, the protrusion structure 320 may come into contact with the $(1-1)^{th}$ groove 412-1, the $(1-2)^{th}$ groove 412-2, the $(1-3)^{th}$ groove 412-3, the support area 416, and the $(2-1)^{th}$ groove 414-1 in order. When the digital pen 400 is separated from the protection cover 300, the order of contact between the protrusion structure 320 and the digital pen 400 may be the reverse of the order in which the digital pen 400 is inserted.

According to an embodiment, the number of first grooves 412-1, 412-2, and 412-3 may be different from the number of second grooves 414-1. For example, the first groove structure 412 may include three first grooves (e.g., the $(1-1)^{th}$ groove 412-1, the $(1-2)^{th}$ groove 412-2, and the $(1-3)^{th}$ groove 412-3), and the second groove structure 414 may include two second grooves (e.g., the $(2-1)^{th}$ groove 414-1 and the $(2-2)^{th}$ groove 414-2). In FIG. 9, the structure in which the first groove structure 412 includes three grooves and the second groove structure 414 includes two grooves is disclosed, but the number of groove structures 410 is not limited thereto. For example, according to an embodiment (not illustrated), the first groove structure 412 may include two or more grooves, and the second groove structure 414 may include one groove.

According to an embodiment, the groove structure 410 may include a first groove structure 412 in which grooves are arranged at a first interval d1 and a second groove structure 414 in which grooves are arranged at a second interval d2. For example, the first groove structure 412 may include a plurality of first grooves (e.g., the $(1-1)^{th}$ groove 412-1, the $(1-2)^{th}$ groove 412-2, and the $(1-3)^{th}$ groove 412-3) arranged at the first interval d1, and the second groove structure 414 may include a plurality of second grooves (e.g., the $(2-1)^{th}$ groove 414-1 and the $(2-2)^{th}$ groove 414-2) arranged at the second interval d2 different from the first interval d1. According to an embodiment, the lengths of the first interval d1 and the second interval d2 may be different from the distance d3 between the first groove structure 412 and the second groove structure 414. According to an embodiment, the grooves of the first groove structure 412 arranged at the first interval d1 may be interpreted as a plurality of first grooves (e.g., the $(1-1)^{th}$ groove 412-1, the $(1-2)^{th}$ groove 412-2, and the $(412-3)^{th}$ groove 412-3) spaced apart from each other by the distance of the first interval d1, and the grooves of the second groove structure 414 arranged at the second interval d2 may be interpreted as a plurality of first grooves (e.g., the $(1-1)^{th}$ grooves 412-1, the $(1-2)^{th}$ grooves 412-2, and the $(1-3)^{th}$ grooves 412-3) spaced apart from each other by the distance of the first interval d1.

According to an embodiment, the processor (e.g., the processor 120 of FIG. 1) determines the mounting state of the digital pen 400 with respect to the protection cover 300 based on sound generated by contact between the protection cover 300 and the digital pen 400. The processor 120 may determine whether the digital pen 400 is mounted in or separated from the protection cover 300 based on sound generated by contact between the protrusion structure 320 and the groove structure 410. For example, the microphone module (e.g., the microphone module 230 in FIG. 10) may change sound generated by contact between the protrusion structure 320 and the groove structure 410 into a sound signal, and the processor 120 may determine whether the digital pen 400 is mounted in or separated from the protection cover 300 based on the sound signal generated by the microphone module 230.

According to an embodiment, the processor 120 may determine whether the digital pen 400 is mounted in the protection cover 300 based on sound. For example, the processor 120 may determine that the digital pen 400 is in a first state in which the digital pen is inserted into the accommodation groove 310 of the protection cover 300 when a second sound signal generated by contact between the second groove structure 414 and the protrusion structure 320 is acquired after a first sound signal generated by contact between the first groove structure 412 and the protrusion structure 320.

According to an embodiment, the processor 120 may determine whether the digital pen 400 is separated from the protection cover 300 based on sound. For example, the processor 120 may determine that the digital pen 400 is in a second state in which the digital pen is separated from the accommodation groove 310 of the protection cover 300 when the first sound signal generated by the contact between the first groove structure 412 and the protrusion structure 320 is acquired after the second sound signal generated by contact between the second groove structure 414 and the protrusion structure 320. According to an embodiment, when it is determined that the digital pen is in the second state, the processor 120 may perform a predetermined operation (e.g., an operation to execute a predetermined program).

According to an embodiment, the processor 120 may determine or distinguish the first sound signal and the second sound signal based on the first groove structure 412 and the second groove structure 414. According to an embodiment, the first sound signal and the second sound signal may be distinguished based on a third sound signal generated based on the sound generated when the protrusion structure 320 comes into contact with the support area 416. The third sound signal may be a sound signal generated substantially based on silence.

According to an embodiment, the processor 120 may distinguish the first sound signal from the second sound signal based on the number of pieces of contact sound (e.g., click sound). For example, the first sound signal may be understood as a sound signal generated by a first predetermined number of pieces of contact sound, and the second sound signal may be interpreted as a sound signal generated by a second predetermined number of pieces of contact sound different from the first predetermined number of pieces of contact sound. According to an embodiment, the first groove structure 412 may include a plurality of (e.g., three) first grooves (e.g., the (1-1)$^{th}$ groove 412-1, the (1-2)$^{th}$ groove 412-2, and the (1-3)$^{th}$ grooves 412-3), and the second groove structure 414 may include second grooves (e.g., (2-1)$^{th}$ groove 414-1), the number of which is different from the number of first grooves 412-1, 412-2, and 412-3 of the first groove structure 412. When acquiring the second sound signal based on one piece of contact sound after the first sound signal based on three pieces of contact sound, the processor 120 may determine that the digital pen 400 is in the state of being inserted into the accommodation groove 310 of the protection cover 300, and when acquiring the first sound signal based on three pieces of contact sound after the second sound signal based on one piece of contact sound, the processor 120 may determine that the digital pen 400 is in the state of being separated from the protection cover 300.

According to an embodiment, the processor 120 may distinguish the first sound signal and the second sound signal based on the interval of the grooves arranged in the first groove structure 412 and the interval of the grooves arranged in the second groove structure 414. For example, the first sound signal may be interpreted as a sound signal generated by contact sound between the protrusion structure 320 and the first groove structure 412 including grooves arranged at the first interval d1, and the second sound signal may be interpreted as a sound signal generated by contact between the protrusion structure 320 and the second groove structure 414 including grooves arranged at the second interval d2 different from the first interval d1. According to an embodiment, the first groove structure 412 may include a plurality of (three) first grooves (e.g., the (1-1)$^{th}$ groove 412-1, the (1-2)$^{th}$ groove 412-2, and the (1-3)$^{th}$ groove 412-3) arranged at the first interval d1, and the second groove structure 414 may include a plurality of (e.g., two) second grooves (e.g., the (2-1)$^{th}$ groove 414-1 and the (2-2)$^{th}$ groove 414-2) arranged at the second interval d2 different from d1. When acquiring the second sound signal based on the contact sound corresponding to the second interval d2 after the first sound signal based on the contact sound corresponding to the first interval d1, the processor 120 may determine that the digital pen 400 is in the state of being inserted into the accommodation groove 310 of the protection cover 300, and when acquiring the first sound signal based on the first interval d1 after the second sound signal based on the contact sound corresponding to the second interval d2, the processor 120 may determine that the digital pen 400 is in the state of being separated from the protection cover 300.

According to an embodiment, the processor 120 may distinguish the first sound signal and the second sound signal based on the waveform of the frequency of the contact sound generated when the groove structure 410 and the protrusion structure 320 come into contact each other. The material of the first groove structure 412 and the material of the second groove structure 414 may be different from each other. For example, a second surface 412a of the first groove structure 412 and a third surface 414a of the second groove structure 414 may be formed of different materials. According to an embodiment, the sound generated when the protrusion structure 320 and the first groove structure 412 come into contact with each other may be different from the sound generated when the protrusion structure 320 and the second groove structure 414 come into contact with each other. According to an embodiment, the waveform of a first frequency of the sound generated by the contact between the protrusion structure 320 and the first groove structure 412 may be different from the waveform of a second frequency of the sound generated by the contact between the protrusion structure 320 and the second groove structure 414.

Figure 10:
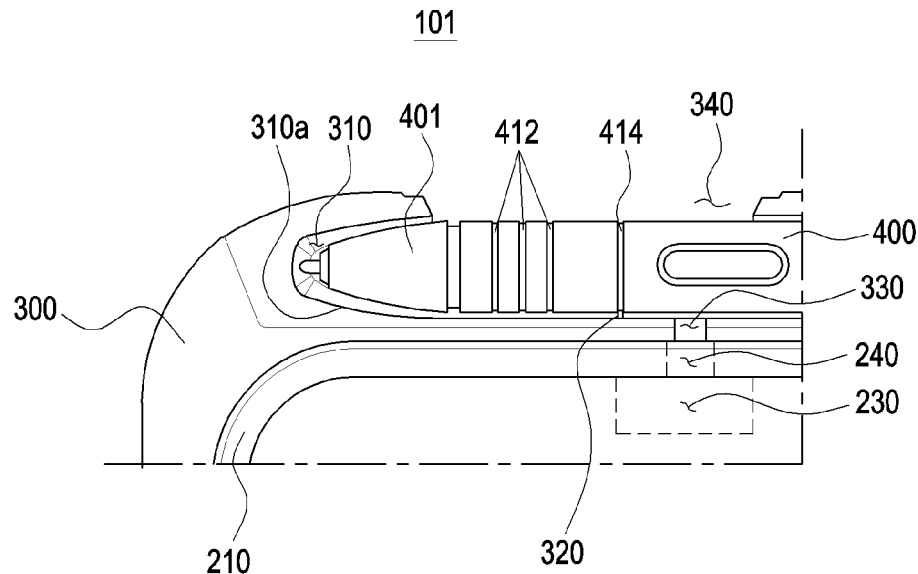
FIG. 10 is a projection view of an electronic device including a protection cover into which a digital pen is inserted, according to an embodiment.
Figure 11:
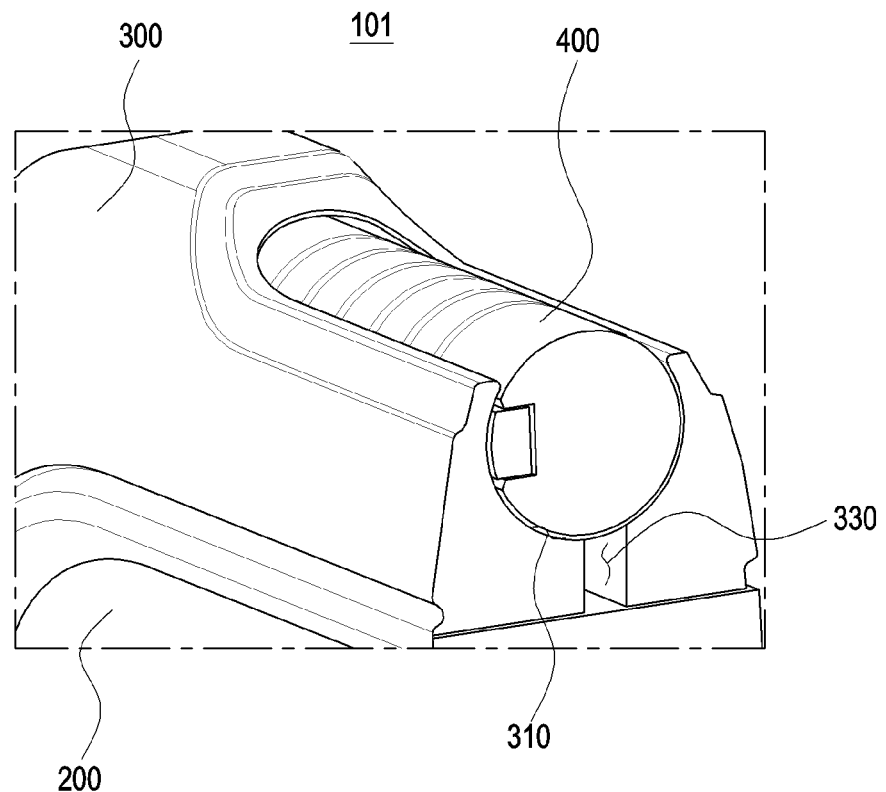
FIG. 11 is a partial perspective view illustrating a cross section of an electronic device including a protection cover into which a digital pen is inserted, according to an embodiment.

FIG. 10 is a projection view illustrating an electronic device including a protection cover into which a digital pen is inserted, according to an embodiment. FIG. 11 is a partial perspective view illustrating a cross section of an electronic device including a protection cover into which a digital pen is inserted, according to an embodiment.

Referring to FIGS. 10 and 11, the portable electronic device 200 may include a microphone module (e.g., including a microphone) 230 capable of acquiring contact sound generated by contact between the digital pen 400 and the protection cover 300. All or some of the components of the portable electronic device 200, the protection cover 300, and the digital pen 400 of FIGS. 10 and 11 may be the same as or similar to those of the portable electronic device 200, the protection cover 300, and the digital pen 400 of FIG. 4, and all or some of the components of the microphone module 230 in FIG. 10 may be the same as or similar to those of the components of the audio module 170 of FIG. 1.

According to an embodiment, the microphone module 230 may acquire contact sound between the protection cover 300 and the digital pen 400. For example, the microphone module 230 may acquire contact sound generated by contact or collision between the protrusion structure 320 of the protection cover 330 and the groove structures 412 and 414 of the digital pen 400 and may convert the contact sound into an electrical signal. According to an embodiment, the microphone module 230 may be disposed within the housing 210. According to an embodiment, the microphone module 230 may be an always on microphone that does not require a user's input signal and receives power from a battery (e.g., the battery 189 in FIG. 1).

According to an embodiment, the digital pen 400 may be spaced apart from at least a portion of the accommodation groove 310 in the state of being inserted into the protection cover 300. For example, the accommodation groove 310 may include a first inner surface 310a that defines at least a portion of the accommodation groove 310 and is capable of facing the digital pen 400, and the first inner surface 310a may be spaced apart from at least a portion of the digital pen 400 (e.g., the pen housing 401 in FIG. 7). For example, contact sound generated by contact or friction between the groove structure 410 of the digital pen 400 and the protection cover 320 may be transferred to the microphone module 230 through a gap (e.g., the accommodation groove 310) between the digital pen 400 and the protection cover 300.

According to an embodiment, the housing 210 of the portable electronic device 200 may include a microphone hole 240. According to an embodiment, the microphone hole 240 may be provided in the housing 210 of the portable electronic device 200. According to an embodiment, the microphone hole 240 may be a microphone duct configured to transfer external sound of the portable electronic device 200 to the microphone module 230. For example, the sound generated within the accommodation groove 310 of the protection cover 300 (e.g., contact sound) may be transferred to the microphone module 230 via the first through hole 330 of the protection cover 300 (e.g., the through hole 330 in FIG. 9). For example, at least a portion of the microphone module 230 may face the microphone hole 240. According to an embodiment, the first through hole 330 may extend from the accommodation groove 310 toward the housing 210 of the portable electronic device 200. According to an embodiment, in the state in which the protection cover 300 is mounted on the portable electronic device 200, the microphone hole 240 may face a portion of the protection cover 300 (e.g., the first through hole 330).

According to an embodiment, the protection cover 300 may include at least one second through hole 340 extending from the accommodation groove 310. According to an embodiment, the second through hole 340 may be provided to face the outside of the electronic device 101. For example, at least a portion of the digital pen 400 mounted or accommodated in the protection cover 300 may be visually exposed to the outside of the electronic device 101 through the second through hole 340. According to an embodiment, the user may touch the digital pen 400 exposed through the second through hole 340 and separate the digital pen 400 from the protection cover 300. According to an embodiment, the second through hole 340 may be located in a different direction from (e.g., opposite direction to) the first through hole 330 with reference to the accommodation groove 310. For example, at least a portion of the accommodation groove 310 may be located between the first through hole 330 and the second through hole 340.

According to various example embodiments of the present disclosure, an electronic device (e.g., the portable electronic device 200 in FIG. 2) may include: a microphone module (e.g., the microphone module 230 in FIG. 10) including a microphone, a housing (e.g., the housing 210 in FIG. 2) configured to accommodate the microphone module and to be at least partially surrounded by a protection cover (e.g., the protection cover 300 in FIG. 10) configured to accommodate a digital pen (e.g., the digital pen 400 in FIG.

10), wherein the housing includes a microphone hole (e.g., the microphone hole 240 in FIG. 10) facing the protection cover, and a processor (e.g., the processor 120 in FIG. 1) disposed within the housing. The processor may be configured to: determine, using the microphone module, a mounting state of the digital pen with respect to the protection cover based on sound generated by contact between a protrusion structure (e.g., the protrusion structure 320 in FIG. 10) of the protection cover and a groove (e.g., the groove structure 410 in FIG. 9) of the digital pen.

Various example embodiments of the disclosure, an electronic device (e.g., the electronic device 101 in FIG. 4) may include: a housing (e.g., the housing 210 in FIG. 2), a protection cover (e.g., the protection cover 300 in FIG. 5) configured to protect the housing, wherein the protection cover includes an accommodation groove (e.g., the accommodation groove 310 in FIG. 5) configured to accommodate a digital pen (e.g., the digital pen 400 in FIG. 6), and a protrusion (e.g., the protrusion structure 320 in FIG. 9) extending from the accommodation groove and configured to contact a groove (e.g., the groove structure 410 in FIG. 6) of the digital pen, and a processor (e.g., the processor 120 in FIG. 1) disposed within the housing. The processor may be configured to: determine a mounting state of the digital pen with respect to the protection cover based on sound generated by contact between the protrusion and the groove.

According to various example embodiments, the electronic device may include a microphone module (e.g., the microphone module 230 in FIG. 10) including a microphone disposed within the housing and configured to acquire sound generated by contact between the digital pen and the protection cover.

According to various example embodiments, the digital pen may include a first groove structure (e.g., the first groove structure 412 in FIG. 9) including at least one first groove (e.g., the $(1\text{-}1)^{th}$ groove 412-1, the $(1\text{-}2)^{th}$ groove 412-2, and the $(1\text{-}3)^{th}$ groove 412-3 in FIG. 9), a second groove structure (e.g., the second groove structure 414 in FIG. 9) including at least one second groove (e.g., the $(2\text{-}1)^{th}$ groove 414-1 and the $(2\text{-}2)^{th}$ groove 414-2 in FIG. 9), and a support area (e.g., the support area 416 in FIG. 9) located between the first groove structure and the second groove structure.

According to various example embodiments, the processor may be configured to determine that the digital pen is in a first state in which the digital pen is inserted into the protection cover based on acquiring a second sound signal generated due to contact between the second groove structure and the protrusion after a first sound signal generated due to contact between the first groove structure and the protrusion, and determine that the digital pen is in a second state in which the digital pen is separated from the protection cover based on acquiring the first sound signal after the second sound signal.

According to various example embodiments, a number of grooves included in the at least one first groove may be different from a number of grooves included in the at least one second groove.

According to various example embodiments, the first groove structure may include a plurality of first grooves arranged at a first interval (e.g., the first interval d1 in FIG. 9), and the second groove structure may include a plurality of second grooves arranged at a second interval (e.g., the second interval d2 in FIG. 9) different from the first interval.

According to various example embodiments, the protection cover may include a first through hole (e.g., the first through hole 330 in FIG. 10) extending from the accommodation groove toward at least a portion of the housing.

According to various example embodiments, the housing may include a microphone hole (e.g., the microphone hole 240 in FIG. 10) facing at least a portion of the first through hole.

According to various example embodiments, the protection cover may comprise thermoplastic polyurethane.

According to various example embodiments, the accommodation groove in the protection cover may include a first inner surface (e.g., the first inner surface 310a in FIG. 10) configured to face the digital pen, and the first inner surface may be spaced apart from at least a portion of the digital pen in a state in which the digital pen is inserted into the protection cover.

According to various example embodiments of the present disclosure, an electronic device (e.g., the electronic device 101 in FIG. 4) may include: a housing (e.g., the housing 210 in FIG. 2), a digital pen (e.g., the digital pen 400 in FIG. 6) including a first groove structure (e.g., the first groove structure 412 in FIG. 9) including at least one first groove (e.g., the $(1-1)^{th}$ groove 412-1, the $(1-2)^{th}$ groove 412-2, and the $(1-3)^{th}$ groove 412-3 in FIG. 9), a second groove structure (e.g., the second groove structure 414 in FIG. 9) including at least one second groove (e.g., the $(2-1)^{th}$ groove 414-1 and the $(2-2)^{th}$ groove 414-2 in FIG. 9), and a support area (e.g., the support area 416 in FIG. 9) located between the first groove structure and the second groove structure, and a protection cover (e.g., the protection cover 300 in FIG. 5) configured to protect the housing, wherein the protection cover includes an accommodation groove (e.g., the accommodation groove 310 in FIG. 9) configured to accommodate the digital pen, and a protrusion (e.g., the protrusion structure 320 in FIG. 9) extending from the accommodation groove and configured to contact the first groove structure and/or the second groove structure, and a processor (e.g., the processor 120 in FIG. 1) disposed within the housing. The processor may be configured to: determine a mounting state of the digital pen with respect to the protection cover based on sound generated by contact between the protrusion structure and the digital pen.

According to various example embodiments, the processor may be configured to: determine that the digital pen is in a first state in which the digital pen is inserted into the protection cover based on acquiring a second sound signal generated due to contact between the second groove structure and the protrusion after a first sound signal generated due to contact between the first groove structure and the protrusion, and to determine that the digital pen is in a second state in which the digital pen is separated from the protection cover based on acquiring the first sound signal after the second sound signal.

According to various example embodiments, the electronic device may further include a microphone module (e.g., the microphone module 230 in FIG. 10) including a microphone disposed within the housing and configured to acquire sound generated by contact between the digital pen and the protection cover.

According to various example embodiments, the protection cover may include a first through hole (e.g., the first through hole 330 in FIG. 11) extending from the accommodation groove toward at least a portion of the housing.

According to various example embodiments, the housing may include a microphone hole (e.g., the microphone hole 240 in FIG. 10) facing at least a portion of the first through hole.

According to various example embodiments, the accommodation groove in the protection cover may include a first inner surface (e.g., the first inner surface 310a in FIG. 10)

configured to face the digital pen, and the first inner surface may be spaced apart from the digital pen in a state in which the digital pen is inserted into the protection cover.

According to various example embodiments of the present disclosure, an electronic device (e.g., the electronic device 101 of FIG. 4) may include: a digital pen (e.g., the digital pen 400 in FIG. 6) including a first groove structure (e.g., the first groove structure 412 in FIG. 9) including at least one first groove (e.g., the $(1-1)^{th}$ groove 412-1, the $(1-2)^{th}$ groove 412-2, and the $(1-3)^{th}$ groove 412-3 in FIG. 9), a second groove structure (e.g., the second groove structure 414 in FIG. 9) including at least one second groove (e.g., the $(2-1)^{th}$ groove 414-1 and the $(2-2)^{th}$ groove 414-2 in FIG. 9), and a support area (e.g., the support area 416 in FIG. 9) located between the first groove structure and the second groove structure, and a protection cover (e.g., the protection cover 300 in FIG. 5) including an accommodation groove (e.g., the accommodation groove 310 in FIG. 5) configured to accommodate the digital pen, wherein the protection cover may include a protrusion (e.g., the protrusion structure 320 in FIG. 9) extending from the accommodation groove and configured to contact the first groove structure or the second groove structure of the digital pen.

According to various example embodiments, a number of grooves of the at least one first groove may be different from a number of grooves of the at least one second groove.

According to various example embodiments, the first groove structure may include a plurality of first grooves (e.g., the $(1-1)^{th}$ groove 412-1, the $(1-2)^{th}$ groove 412-2, and $(1-3)^{th}$ groove 412-3 in FIG. 9) arranged at a first interval (e.g., the first interval d1 in FIG. 9), and the second groove structure may include a plurality of second grooves (e.g., the $(2-1)^{th}$ groove 414-1 and the $(2-2)^{th}$ groove 414-2 in FIG. 9) arranged at a second interval (e.g., the second interval d2 in FIG. 9) different from the first interval.

According to various example embodiments of the present disclosure, a protection cover (e.g., the protection cover 300 in FIG. 4) configured to protect a housing (e.g., the housing 210 of FIG. 2) of an electronic device (e.g., the portable electronic device 200 in FIG. 2) may include: an accommodation groove (e.g., the accommodation groove 310 in FIG. 5) configured to accommodate a digital pen (e.g., the digital pen 400 in FIG. 4), a protrusion (e.g., the protrusion structure 320 in FIG. 10) protruding from the accommodation groove and configured to contact the groove in the digital pen, a first through hole (e.g., the first through hole 330 in FIG. 10) extending from the accommodation groove and configured to transmit sound generated based on contact between the protrusion structure and the digital pen to a microphone of the electronic device, and a second through hole (e.g., the second through hole 340 in FIG. 10) extending from the accommodation groove, wherein the accommodation groove may be located between the first through hole and the second through hole.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device comprising:

a microphone module comprising a microphone;

a housing comprising a front surface, a rear surface, and a side surface surrounding a space between the front surface and the rear surface, wherein the housing is configured to accommodate the microphone module and a display viewable through the front surface, and to be at least partially surrounded by a protection cover comprising an accommodation groove configured to accommodate a digital pen and a through hole extending from the accommodation groove toward the side surface of the housing, wherein the side surface of the housing comprises a microphone hole at least partially aligned with the through hole and facing the digital pen based on the digital pen being disposed in the accommodation groove; and at least one processor comprising processing circuitry and disposed within the housing; and memory storing instructions that, when executed by the at least one processor individually or collectively, cause the electronic device to:

determine, using the microphone module, a mounting state of the digital pen with respect to the protection cover based on sound generated by contact between a protrusion of the protection cover and a groove of the digital pen.

2. The electronic device of claim 1, wherein the protrusion extends from the accommodation groove.

3. The electronic device of claim 1, wherein the digital pen comprises a first groove structure comprising at least one first groove, a second groove structure comprising at least one second groove, and a support area located between the first groove structure and the second groove structure.

4. The electronic device of claim 3, wherein the instructions, when executed by the at least one processor individually or collectively, cause the electronic device to:

determine that the digital pen is in a first state in which the digital pen is inserted into the protection cover based on acquiring a second sound signal generated due to contact between the second groove structure and the protrusion after a first sound signal generated due to contact between the first groove structure and the protrusion; and determine that the digital pen is in a second state in which the digital pen is separated from the protection cover based on acquiring the first sound signal after the second sound signal.

5. The electronic device of claim 4, wherein a number of grooves of the at least one first groove is different from a number of grooves of the at least one second groove, and the at least one processor, individually and/or collectively, is configured to distinguish the first sound signal and the second sound signal based on the number of grooves of the at least one first groove and the number of grooves of the at least one second groove.

6. The electronic device of claim 3, wherein the first groove structure comprises a plurality of first grooves arranged at a first interval, and the second groove structure comprises a plurality of second grooves arranged at a second interval different from the first interval.

7. The electronic device of claim 1, wherein the through hole is disposed adjacent to the microphone hole.

8. An electronic device comprising:

a housing comprising a front surface, a rear surface, and a side surface surrounding a space between the front surface and the rear surface, wherein the housing is configured to accommodate a microphone module including a microphone and a display viewable through the front surface;

a protection cover configured to protect the housing, the protection cover comprising an accommodation groove configured to accommodate a digital pen, a protrusion extending from the accommodation groove and configured to contact a groove of the digital pen, and a through hole extending from the accommodation groove toward the side surface of the housing, wherein the side surface of the housing comprises a microphone hole at least partially aligned with the through hole and facing the digital pen based on the digital pen being disposed in the accommodation groove; and at least one processor comprising processing circuitry and disposed within the housing; and memory storing instructions that, when executed by the at least one processor individually or collectively, cause the electronic device to:

determine a mounting state of the digital pen with respect to the protection cover based on sound generated by contact between the protrusion and the groove.

9. The electronic device of claim 8, wherein the digital pen comprises a first groove structure comprising at least one first groove, a second groove structure comprising at least one second groove, and a support area located between the first groove structure and the second groove structure.

10. The electronic device of claim 9, wherein the instructions, when executed by the at least one processor individually or collectively, cause the electronic device to:

determine that the digital pen is in a first state in which the digital pen is inserted into the protection cover based on acquiring a second sound signal generated due to contact between the second groove structure and the protrusion after a first sound signal generated due to contact between the first groove structure and the protrusion; and determine that the digital pen is in a second state in which the digital pen is separated from the protection cover based on acquiring the first sound signal after the second sound signal.

11. The electronic device of claim 10, wherein a number of grooves of the at least one first groove is different from a number of grooves of the at least one second groove.

12. The electronic device of claim 11, wherein the instructions, when executed by the at least one processor individually or collectively, cause the electronic device to distinguish the first sound signal and the second sound signal based on the number of grooves of the at least one first groove and the number of grooves of the at least one second groove.

13. The electronic device of claim 9, wherein the first groove structure comprises a plurality of first grooves arranged at a first interval, and the second groove structure comprises a plurality of second grooves arranged at a second interval different from the first interval.

14. The electronic device of claim 8, wherein the protection cover comprises thermoplastic polyurethane.

15. The electronic device of claim 8, wherein the accommodation groove in the protection cover comprises a first inner surface facing the digital pen, and the first inner surface is spaced apart from at least a portion of the digital pen in a state in which the digital pen is inserted into the protection cover.

16. The electronic device of claim 8, wherein the electronic device further comprises the microphone module configured to acquire sound generated by contact between the digital pen and the protection cover.

17. The electronic device of claim 8, wherein the through hole is disposed adjacent to the microphone hole.

18. The electronic device of claim 8, wherein the protrusion of the protection cover is provided between the through hole and a portion of the accommodation groove configured to receive a tip of the digital pen.

19. A protection cover configured to protect a housing of an electronic device, the housing comprising a front surface, a rear surface, and a side surface surrounding a space between the front surface and the rear surface, the protection cover comprising:

an accommodation groove defining a space configured to accommodate a digital pen, a protrusion protruding from the accommodation groove and configured to contact a groove on the digital pen, a first through hole extending from the accommodation groove toward the side surface of the housing, facing the digital pen based on the digital pen being disposed in the accommodation groove, and configured to transmit sound generated based on contact between the protrusion and the digital pen to a microphone disposed in the housing of the electronic device through the first through hole and a microphone hole in the side surface of the housing, at least partially aligned with the first through hole, and facing the digital pen based on the digital pen being disposed in the accommodation groove, and a second through hole extending from the accommodation groove in a direction away from the side surface of the housing and at least partially aligned with the first through hole, wherein the accommodation groove is located between the first through hole and the second through hole, and wherein the space of the accommodation groove is acoustically coupled to a microphone hole of the electronic device configured to guide an external sound to a microphone inside the electronic device.

20. The protection cover of claim 19, wherein the digital pen comprises a first groove structure comprising at least one first groove, a second groove structure comprising at least one second groove, and a support area located between the first groove structure and the second groove structure.

* * * * *